(12) United States Patent
Bergman et al.

(10) Patent No.: US 9,661,743 B1
(45) Date of Patent: May 23, 2017

(54) FLEXIBLE CIRCUIT BOARD AND METHOD OF FABRICATING

(71) Applicant: Multek Technologies Ltd., San Jose, CA (US)

(72) Inventors: Mark Bergman, Redwood City, CA (US); Joan K. Vrtis, Mesa, AZ (US)

(73) Assignee: Multek Technologies, Ltd., San Jose, CA (US)

(*) Notice: Subject to any disclaimer, the term of this patent is extended or adjusted under 35 U.S.C. 154(b) by 44 days.

(21) Appl. No.: 14/565,247

(22) Filed: Dec. 9, 2014

Related U.S. Application Data

(60) Provisional application No. 61/913,830, filed on Dec. 9, 2013.

(51) Int. Cl.
| | |
|---|---|
| H05K 1/00 | (2006.01) |
| H05K 1/02 | (2006.01) |
| H05K 3/46 | (2006.01) |
| H05K 1/03 | (2006.01) |
| H05K 1/09 | (2006.01) |

(52) U.S. Cl.
CPC ......... *H05K 1/0271* (2013.01); *H05K 1/0298* (2013.01); *H05K 1/0306* (2013.01); *H05K 1/0393* (2013.01); *H05K 1/09* (2013.01); *H05K 3/4644* (2013.01); *H05K 2201/0154* (2013.01); *H05K 2201/0158* (2013.01); *H05K 2201/0162* (2013.01)

(58) Field of Classification Search
CPC ................. H05K 1/0278; H05K 1/148; H05K 2201/058; H05K 3/4691; H05K 1/0366; H05K 1/0393; H05K 2201/029
See application file for complete search history.

(56) References Cited

U.S. PATENT DOCUMENTS

| | | | |
|---|---|---|---|
| 2,911,605 A | 11/1959 | Wales, Jr. | |
| 4,051,425 A | 9/1977 | Smith | |
| 4,495,546 A | 1/1985 | Nakamura et al. | |
| 4,687,695 A * | 8/1987 | Hamby | H05K 3/4691 |
| | | | 174/254 |
| 4,712,160 A | 12/1987 | Sato et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |

(Continued)

*Primary Examiner* — Chau Nguyen
*Assistant Examiner* — Roshn Varghese
(74) *Attorney, Agent, or Firm* — Haverstock & Owens LLP

(57) ABSTRACT

A flexible circuit board includes a center "rigid" section, such as a printed circuit stack, and an adjoining flexible multi-layer body that are fabricated from a common interconnect layer. A transition material is included at the interface between the center rigid section and the flexible multi-layer body to minimize ripping and cracking of the interconnect layer. The transition material can also be added at stress areas not related to the interface. The transition material is attached at the interface and stress areas of the flexible circuit board in order to strengthen the flexible circuit board in general and in particular the transition material included therein. The transition material layer is formed and deposited at one or more locations on or within the flexible circuit board in order to minimize, reduce, if not prevent cracking and ripping of the flexible circuit board as it is bent, flexed and/or twisted.

20 Claims, 10 Drawing Sheets

(56) References Cited

U.S. PATENT DOCUMENTS

| | | | | |
|---|---|---|---|---|
| 4,975,821 A | | 12/1990 | Lethellier | |
| 5,101,322 A | | 3/1992 | Ghaem et al. | |
| 5,144,742 A | * | 9/1992 | Lucas | H05K 3/4691 174/254 |
| 5,164,657 A | | 11/1992 | Gulczynski | |
| 5,235,491 A | | 8/1993 | Weiss | |
| 5,262,594 A | * | 11/1993 | Edwin | H05K 3/3452 174/254 |
| 5,262,932 A | | 11/1993 | Stanley et al. | |
| 5,295,044 A | | 3/1994 | Araki et al. | |
| 5,398,128 A | * | 3/1995 | Tajima | H01L 23/145 257/E23.007 |
| 5,490,052 A | | 2/1996 | Yoshida et al. | |
| 5,499,444 A | * | 3/1996 | Doane, Jr. | H05K 3/4691 174/254 |
| 5,565,761 A | | 10/1996 | Hwang | |
| 5,565,781 A | | 10/1996 | Dauge | |
| 5,592,128 A | | 1/1997 | Hwang | |
| 5,712,772 A | | 1/1998 | Telefus et al. | |
| 5,742,151 A | | 4/1998 | Hwang | |
| 5,747,977 A | | 5/1998 | Hwang | |
| 5,798,635 A | | 8/1998 | Hwang et al. | |
| 5,804,950 A | | 9/1998 | Hwang et al. | |
| 5,811,895 A | | 9/1998 | Suzuki et al. | |
| 5,818,207 A | | 10/1998 | Hwang | |
| 5,870,294 A | | 2/1999 | Cyr | |
| 5,894,243 A | | 4/1999 | Hwang | |
| 5,903,138 A | | 5/1999 | Hwang et al. | |
| 5,905,369 A | | 5/1999 | Ishii et al. | |
| 5,923,543 A | | 7/1999 | Choi | |
| 5,997,983 A | * | 12/1999 | Caron | H05K 1/0366 174/254 |
| 6,039,600 A | | 3/2000 | Etters et al. | |
| 6,058,026 A | | 5/2000 | Rozman | |
| 6,069,803 A | | 5/2000 | Cross | |
| 6,077,124 A | | 6/2000 | Etters et al. | |
| 6,160,725 A | | 12/2000 | Jansen | |
| 6,272,015 B1 | | 8/2001 | Mangtani | |
| 6,282,092 B1 | | 8/2001 | Okamoto et al. | |
| 6,288,343 B1 | * | 9/2001 | Ahn | H05K 3/4691 174/254 |
| 6,344,980 B1 | | 2/2002 | Hwang et al. | |
| 6,358,064 B2 | | 3/2002 | Szalay et al. | |
| 6,396,277 B1 | | 5/2002 | Fong et al. | |
| 6,407,514 B1 | | 6/2002 | Glaser et al. | |
| 6,469,914 B1 | | 10/2002 | Hwang et al. | |
| 6,469,980 B1 | | 10/2002 | Takemura et al. | |
| 6,483,037 B1 | | 11/2002 | Moore | |
| 6,483,281 B2 | | 11/2002 | Hwang | |
| 6,531,854 B2 | | 3/2003 | Hwang | |
| 6,541,944 B2 | | 4/2003 | Hwang | |
| 6,578,253 B1 | | 6/2003 | Herbert | |
| 6,605,930 B2 | | 8/2003 | Hwang | |
| 6,657,417 B1 | | 12/2003 | Hwang | |
| 6,671,189 B2 | | 12/2003 | Jansen et al. | |
| 6,674,272 B2 | | 1/2004 | Hwang | |
| 6,711,024 B1 | | 3/2004 | Johansson | |
| 6,958,920 B2 | | 10/2005 | Mednik et al. | |
| 7,047,059 B2 | | 5/2006 | Avrin et al. | |
| 7,286,376 B2 | | 10/2007 | Yang | |
| 7,439,962 B2 | | 10/2008 | Reynolds et al. | |
| 8,188,372 B2 | * | 5/2012 | Sato | H05K 3/4691 174/254 |
| 2002/0011823 A1 | | 1/2002 | Lee | |
| 2003/0035303 A1 | | 2/2003 | Balakrishnan et al. | |
| 2004/0192082 A1 | * | 9/2004 | Wagner | H05K 1/0283 439/67 |
| 2004/0228153 A1 | | 11/2004 | Cao et al. | |
| 2005/0105224 A1 | | 5/2005 | Nishi | |
| 2005/0281425 A1 | | 12/2005 | Greuet et al. | |
| 2006/0120059 A1 | * | 6/2006 | Farkas | H05K 1/0366 361/777 |
| 2007/0090894 A1 | | 4/2007 | Phan | |
| 2008/0047135 A1 | * | 2/2008 | Arnold | H05K 3/4691 29/829 |
| 2008/0289859 A1 | * | 11/2008 | Mikado | H05K 1/0281 174/254 |
| 2009/0314523 A1 | * | 12/2009 | Ito | B32B 17/04 174/254 |
| 2009/0317639 A1 | * | 12/2009 | Axisa | B32B 37/185 428/411.1 |
| 2010/0012362 A1 | | 1/2010 | Abe | |
| 2011/0120754 A1 | * | 5/2011 | Kondo | H01L 23/14 174/254 |
| 2013/0213695 A1 | | 8/2013 | Lee | |
| 2015/0029652 A1 | * | 1/2015 | Min | G06F 1/1652 361/679.27 |

* cited by examiner

FLEXIBLE CIRCUIT BOARD AND METHOD OF FABRICATING

RELATED APPLICATIONS

This patent application claims priority under 35 U.S.C. 119 (e) of the U.S. Provisional Application, Ser. No. 61/913, 830, filed Dec. 9, 2013, and entitled "METAL FABRIC STITCHING AND STRETCHABLE BATTERIES". This application incorporates U.S. Provisional Application, Ser. No. 61/913,830 in its entirety by reference.

FIELD OF THE INVENTION

The present invention is generally directed to wearable electronics and wearable electronic medical devices. More specifically, the present invention is directed to a means for limiting stress in and strengthening deformable electronics.

BACKGROUND OF THE INVENTION

Electronic devices are increasingly being developed so as to be worn by a user, such as in wearable electronics. As these wearable electronics gain traction in the marketplace, a new breed of devices that are able to bend, flex and stretch must be developed. These mechanical requirements present reliability challenges on mechanical components, circuit boards and interconnects, as well as electronic components. In order to limit the stress and strain to these components while still maintaining flexibility, mechanical provisions must be put in place.

SUMMARY OF THE INVENTION

A flexible circuit board and a method of fabricating the flexible circuit board are described. A center "rigid" section, such as a printed circuit stack, and an adjoining flexible multi-layer body are fabricated from a common interconnect layer. A transition material is included at the interface between the center rigid section and the flexible multi-layer body to minimize ripping and cracking of the interconnect layer. The transition material can also be added at stress areas not related to the interface. The transition material is attached at the interface and stress areas of the flexible circuit board in order to strengthen the flexible circuit board in general and in particular the transition material included therein. The transition material layer is formed and deposited at one or more locations on or within the flexible circuit board in order to minimize, reduce, if not prevent cracking and ripping of the flexible circuit board as it is bent, flexed and/or twisted.

In one aspect, a flexible circuit board is disclosed that includes a flexible multi-layer body, a center section and a transition material. The flexible multi-layer body includes an interconnect layer with one or more flexible insulating layers coupled to the interconnect layer. The center section is more rigid than the flexible multi-layer body. The center section includes the interconnect layer such that the interconnect layer extends as a common layer to both the flexible multi-layer body and the center section. The transition material is positioned at one or more transition locations between the flexible multi-layer body and the center section in order to provide structural support. In some embodiments, transition material is configured to minimize, reduce, if not prevent the flexible multi-layer body from cracking as the flexible multi-layer body is flexed, bent or twisted. In some embodiments, the transition material has a lower elasticity than the flexible insulating layers of the flexible multi-layer body, but a higher elasticity than the center section. In some embodiments, the transition material is positioned at a high stress location of the flexible circuit board. In some embodiments, the transition material is an open weave interlocking fabric. In some embodiments, the center section is a printed circuit stack. In some embodiments, the printed circuit stack includes one or more rigid or flexible sections and one or more pre-preg or adhesive sections. In some embodiments, the rigid sections are one of glass-filled material, pre-preg or foil laminates. In some embodiments, the flexible sections are one of polyimide, polyethylene teraphthalate (PET), polyethylene nitride (PEN) or polyurethane. In some embodiments, the flexible insulating layers are one of silicone or polyurethane. In some embodiments, the interconnect layer is a copper foil patterned to form one or more interconnects.

In another aspect, another flexible circuit board is disclosed that includes a flexible multi-layer body, a center section and a transition material. The flexible multi-layer body includes an interconnect layer with one or more stretchable insulating layers coupled to the interconnect layer, wherein the interconnect layer includes interconnects formed in a non-linear pattern to allow the interconnect layer to be stretched. The center section is more rigid than the flexible multi-layer body. The center section includes the interconnect layer such that the interconnect layer extends as a common layer to both the flexible multi-layer body and the center section. The transition material is positioned at one or more transition locations between the flexible multi-layer body and the center section in order to provide structural support.

In yet another aspect, a method of strengthening a flexible circuit board is disclosed. The method includes forming a printed circuit stack on a portion of an interconnect layer. The method also includes forming a flexible multi-layer body that includes a flexible insulating layer over another portion of the interconnect layer such that the interconnect layer extends as a common layer to both the flexible multi-layer body and the printed circuit stack. The flexible insulating layer is adjacently coupled to the printed circuit stack. The method also includes positioning a transition material at one or more transition locations between the flexible multi-layer body and the center section in order to provide structural support.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a flexible circuit board. Those of ordinary skill in the art will realize that the following detailed description of a flexible circuit board is illustrative only and is not intended to be in any way limiting. Other embodiments of a flexible circuit board will readily suggest themselves to such skilled persons having the benefit of this disclosure.

Reference will now be made in detail to implementations of the flexible circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments are directed to a flexible circuit board and methods of fabricating the flexible circuit board in order to strengthen the circuit and minimize, reduce, if not prevent rips and cracks. The flexible circuit board includes a flexible multi-layer body coupled to a central rigid section. In some embodiments, the central rigid section includes device electronics and the flexible multi-layer body includes electronic interconnects, such as electrically conductive traces, coupled to the device electronics. In some embodiments, one or more transition materials are added at a stress area of a flexible circuit board in order to strengthen the flexible circuit board and minimize ripping and cracking, such as when the flexible circuit board is bent, flexed or twisted. The transition material can be placed at different locations on and within the flexible circuit board. For example, in some embodiments, the transition material is dispersed throughout the flexible circuit board as a coverlay, an underlay, and symmetrically or asymmetrically positioned within the flexible circuit board as an overlay and an underlay.

Figure 1:
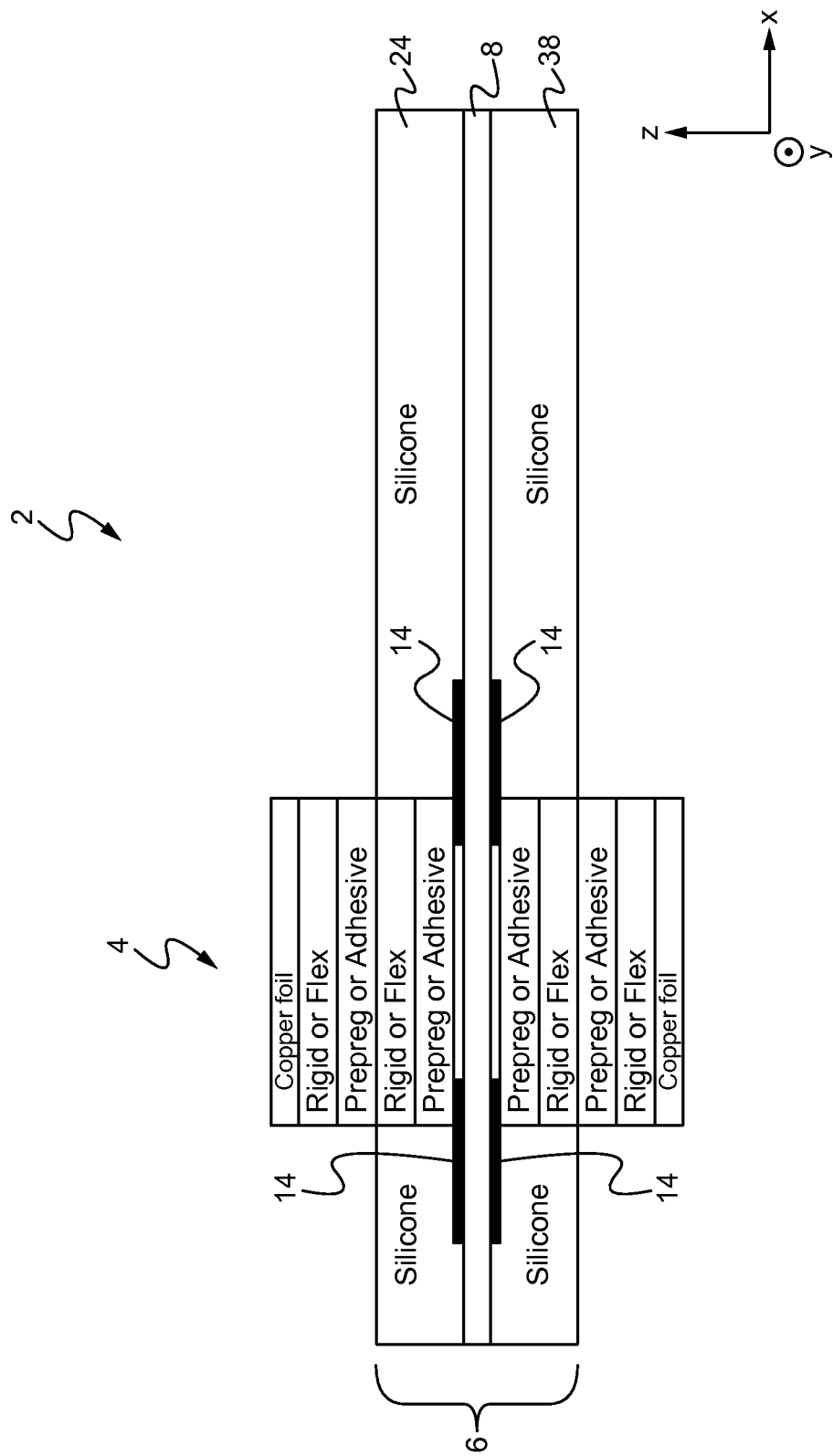
FIG. 1 illustrates a flexible circuit board in accordance with some embodiments.

Referring now to FIG. 1, a flexible circuit board or deformable electronic is depicted therein. The flexible circuit board 2 includes a multi-layer body 6 which has a top cover layer 24, a bottom cover layer 38, and an interconnect layer 8. The multi-layer body 6 is coupled to a center "rigid" section 4. Although the flexible circuit board 2 is shown having a top coverlay 24 and a bottom coverlay 38, the flexible circuit board 2 is able to include more or less coverlays as appropriately desired. In some embodiments, each coverlay is made of silicone. In other embodiments, alternative types of insulating material can be used as the coverlay, where the insulating material is flexible. In some embodiments, the interconnect layer 8 is an electrically conductive layer made of a metal, such as copper, that is patterned into electrically conductive traces. It is understood that alternative types of electrically conductive material can be used. In some embodiments, the interconnects are electrical interconnects, such as conductive traces. In other embodiments, the interconnects are optical interconnects, such as waveguides. It is understood that other types of interconnects are contemplated. In some embodiments, the interconnects are configured in a non-linear pattern, such as a S-shape or a zig-zap shape, so as to enable the multi-layer body 6 to stretch in one or more directions.

The center rigid section 4 can include one or more rigid or flexible sections and one or more pre-preg or adhesive sections configured to form a printed circuit stack. The interconnect layer 8 extends through both the multi-layer body 6 and the center rigid section 4 and is therefore common to both. The sections of the printed circuit stack of the center rigid section are formed on an appropriate section of the interconnect layer 8. The coverlays 24 and 38, such as those formed using silicone, protect the interconnect layer 8 extending from the center rigid section 4. Interconnects can be formed within and between the various layers of the printed circuit stack as are well known in the art. A patterned interconnected layer is formed on either end or both ends of the center rigid stack. In some embodiments, the patterned interconnect layer on either or both ends of the center rigid stack forms a high density interconnect onto which an electronic device can be mounted. In this manner, the center rigid section can be referred to as an active region of the flexible circuit board. The interconnect layer 8 is electrically coupled to the center rigid stack 4 and therefore provides connectivity to and from the active region. In this manner, the multi-layer body 6 including the interconnect layer 8 can be referred to as a passive region. Sections of the center rigid section 4 are referred to as rigid or flexible sections because that particular section is made of either a rigid material or a flexible material. Rigid materials can include, but are not limited to, glass-filled material, pre-preg or foil laminates. Flexible, of "flex", materials can include, but are not limited to, polyimide, polyethylene teraphthalate (PET), polyethylene nitride (PEN) or polyurethane. Sections of the center rigid section 4 are referred to as pre-preg or adhesive sections because that particular section is made of either a pre-preg material or an adhesive material. In some embodiments, when the rigid or flexible section is made of the rigid material, then the adjacent pre-preg or adhesive section is made of the pre-preg material, and when the rigid or flexible section is made of the flexible material, then the adjacent pre-preg or adhesive section is made of the adhesive material. In an application where the center rigid section 4 is made of a stack of flexible sections, the resulting stack is still considered rigid as multiple stacked flexible sections serially decrease the overall flexibility of the resulting stack. In some embodiments, the rigid or flexible sections and the pre-preg or adhesive sections are laminated together, either using a single lamination step or using multiple separate lamination steps where during each separate lamination step a sub-set of the sections are laminated together.

One or more transition material layers 14 are positioned throughout the multi-layer body 6 of the flexible circuit board 2. The one or more transition material layers 14 strengthen the flexible circuit board 2 so as to minimize, if not prevent, ripping or cracking as the flexible circuit board 2 is bent, flexed, or twisted. The one or more transition material layers 14 are attached at one or more specific locations in order to strengthen the flexible circuit board 2. The one or more transition material layers 14 can be deposited on the inner layers and/or outer layers of the flexible circuit board 2 depending upon the desired application. As shown in FIG. 1, the transition material layers 14 are added at the transition points between the center rigid section 4 and the multi-layer body 6. Additionally, one or more transition material layers can be placed in other high stress areas of the flexible circuit board such as where it is commonly twisted, bent, or flexed. Accordingly, the flexible circuit board is strengthened in its high stress areas. In this manner coupling one or more transition material layers to the flexible circuit board decreases the chance that the flexible circuit board will rip or tear and mechanically fail.

In some embodiments, the transition material is an open weave fabric including a series of threads woven in an interlocking cross-hatching pattern. During weaving, the threads are interwoven at regular intervals in the cross-hatch pattern. The cross-hatch pattern and reinforcing technique makes the transition material resistant to ripping and tearing while maintaining a high strength to weight ratio. In some embodiments, the one or more transition material layers 14 utilize a thermal set adhesive embedded within an open weave fabric and are attached to appropriate layer of the flexible circuit board 2. In some embodiments the one or more transition material layers are heat resistant. In some embodiments, the transition material has a lower elasticity than the flexible insulating material of the multi-layer body, but a higher elasticity than the center rigid section. As shown in FIG. 1, the one or more transition material layers 14 are coupled to either side of the cooper foil 8. It is understood that the transition material layers can be applied to alternate and/or additional locations within the flexible circuit board. Use of transition material within a flexible circuit board can be found in the co-pending U.S. patent application Ser. No. 14/565,227, which is hereby incorporated in its entirety by reference.

Figure 2:
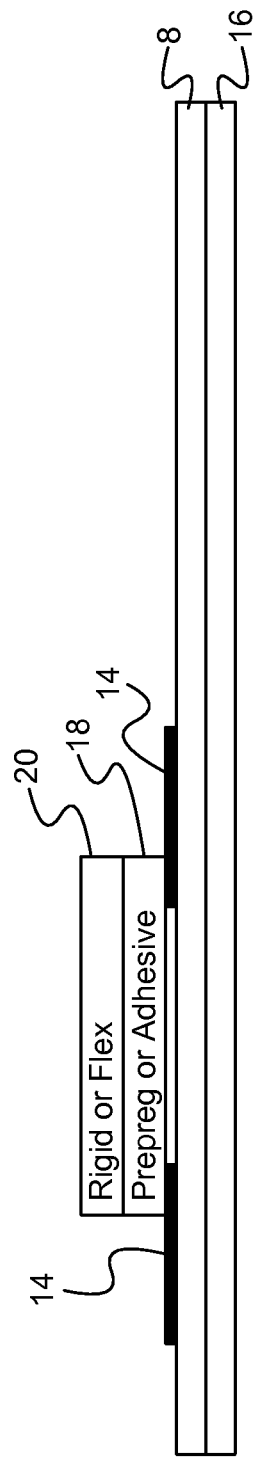
FIGS. 2-10 illustrate various method steps in the fabrication of the flexible circuit board in accordance with some embodiments.

FIGS. 2-10 illustrate method steps in the fabrication of the flexible circuit board in accordance with some embodiments. Referring to FIG. 2, the interconnect layer 8 is coupled to a temporary carrier 16. In this exemplary embodiment, the interconnect layer 8 is a copper foil and the temporary carrier 16 is a mechanism sufficient to support and maintain in place the cooper foil. In some embodiments, the temporary carrier 16 is a copper carrier. Transition material layers 14 are placed at interface areas between the interconnect layer 8 and the center rigid section 4, shown in FIG. 1. A pre-preg or adhesive section 18 is placed on the transition layers 14 and the interconnect layer 8. The pre-preg or adhesive section 18 is made of either a pre-preg material or an adhesive material of the type previously described. A rigid or flexible section 20 is placed on the pre-preg or adhesive section 18. The rigid or flexible section 20 is made of either a rigid material or a flexible material of the type previously described. In an alternative process, the pre-preg or adhesive section 18 can be applied to the rigid or flexible section 20 separately, and the resulting combination can then be placed on the transition layers 14 and the interconnect layer 8. The interconnect layer 8, the transition material layers 14, the pre-preg or adhesive section 18 and the rigid or flexible section 20 are laminated together using any known lamination technique.

Figure 3:
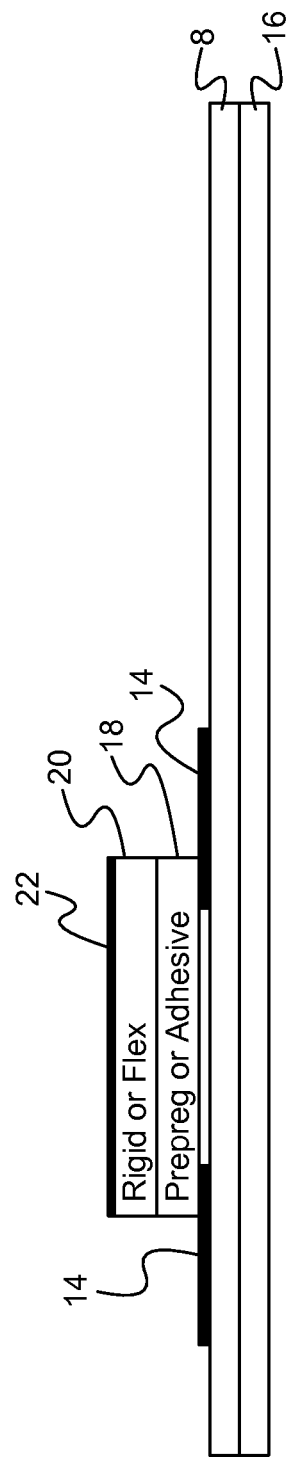

Referring to FIG. 3, a protective tap cover (PTC) 22 is placed on the rigid or flexible section 20. In some embodiments, the PTC is a polymer with a light adhesive for temporarily securing to the rigid or flexible section 20. It is understood that other conventional PTCs can be used.

Figure 4:
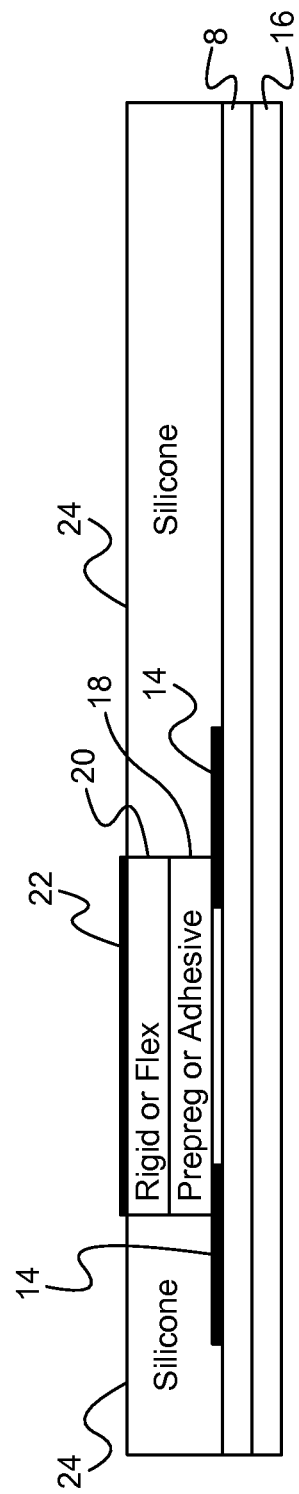

Referring to FIG. 4, a flexible insulating layer 24 is applied on the interconnect layer 8 and any exposed portions of the transition material layers 14. In some embodiments, the flexible insulating layer 24 is made of silicone. In other embodiments, the flexible insulating layer 24 is made of polyurethane. It is understood that other flexible insulating materials can be used. The flexible insulating material 24 has an adhesive characteristic so as to adhere to interconnect layer 8 and to the stack formed by the pre-preg or adhesive section 18 and the rigid or flexible section 20. The flexible insulating layer 24 can be applied using any conventional techniques including, but not limited to, to those used in slot dye applications, a squeegee, roller-coating, printing or stack filling. In some embodiments, a thickness of the flexible insulating layer 24 is configured so that a top surface is flush with a top surface of the rigid or flexible section 20.

Figure 5:
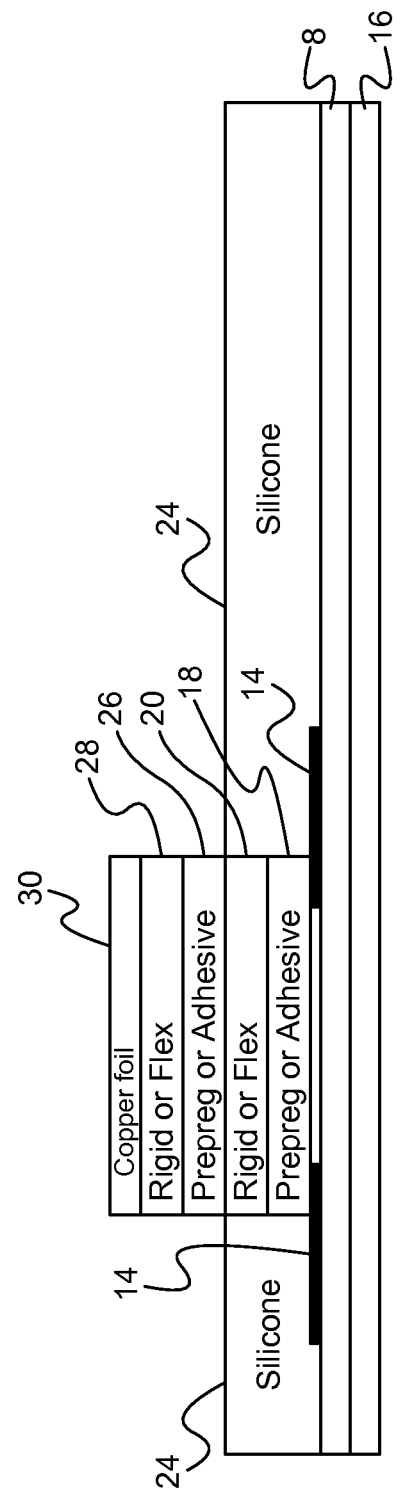

Referring to FIG. 5, the PTC 22 is removed. A pre-preg or adhesive section 26 is placed on the rigid or flexible section 20. The pre-preg or adhesive section 26 is made of either a pre-preg material or an adhesive material of the type previously described. A rigid or flexible section 28 is placed on the pre-preg or adhesive section 26. The rigid or flexible section 28 is made of either a rigid material or a flexible material of the type previously described. An interconnect layer 30 is placed on the rigid or flexible section 28. In some embodiments, the interconnect layer 30 is a copper foil. In an alternative process, the pre-preg or adhesive section 26 can be applied to the rigid or flexible section 28 separately, and the resulting combination can then be placed on the rigid or flexible section 20. The rigid or flexible section 20, the pre-preg or adhesive section 26, the rigid or flexible section 28 and the interconnect layer 30 are laminated together using any known lamination technique. In some embodiments, one or more transition material layers can be placed on the rigid or flexible section 20 and the flexible insulating layer 24 prior to placing the pre-preg or adhesive section 26.

Figure 6:
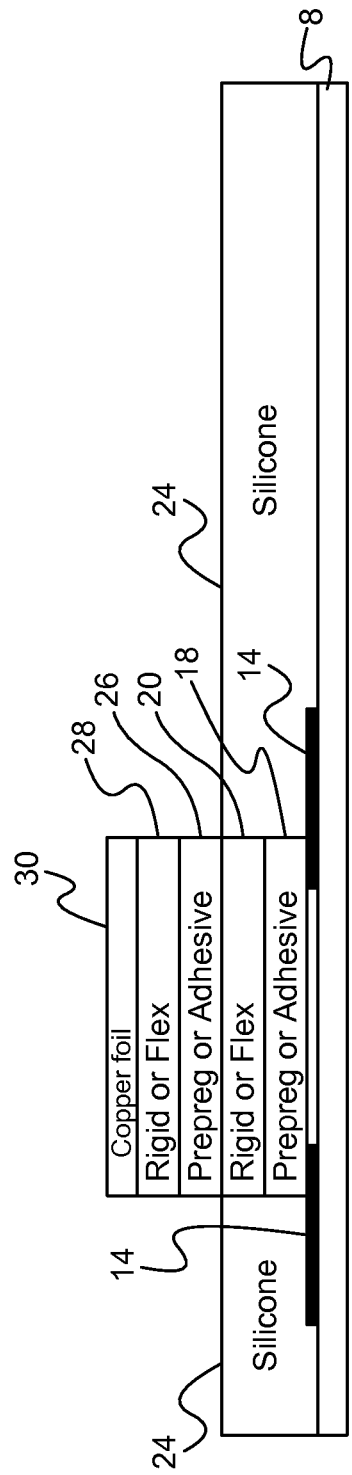

Referring to FIG. 6, the temporary carrier 16 is removed. The interconnect layer 8 is patterned to form the desired configuration of interconnects. In some embodiments, the interconnects are formed in an S-shape, a zig-zag shape or any other pattern that enables the multi-layer body 6 (FIG. 1) to be stretched in one or more directions. The interconnect layer 8 can be patterned using any conventional patterning technique. For example, in the case where the interconnect layer 8 is a copper foil, the copper foil is imaged and etched.

Figure 7:
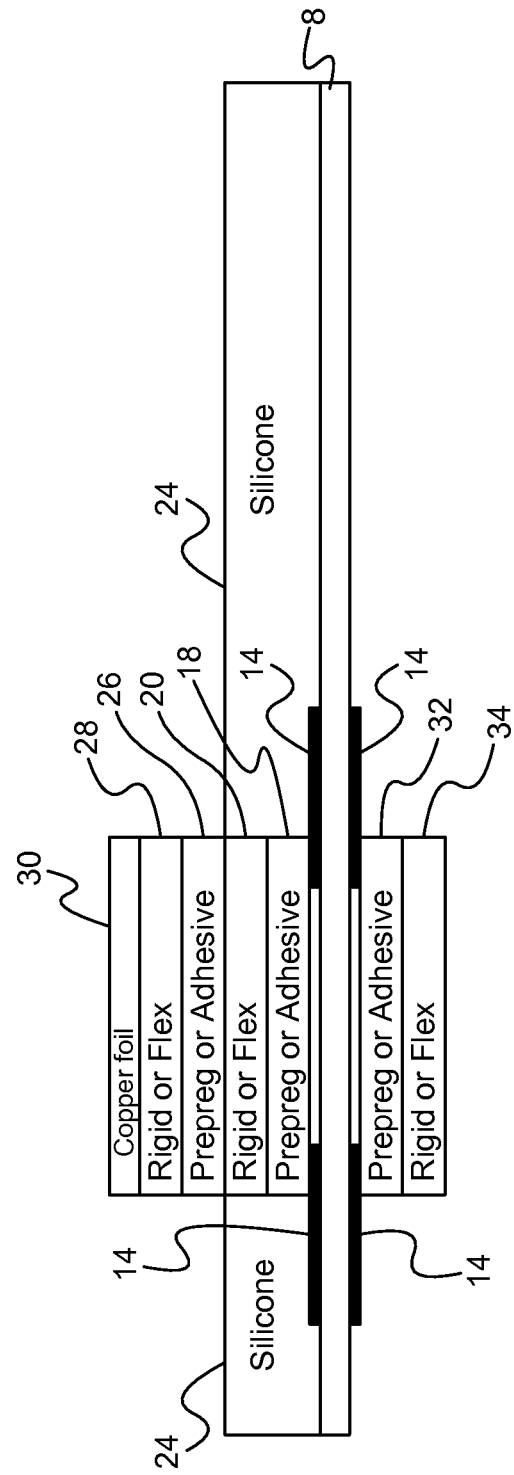

Referring to FIG. 7, transition material layers 14 are placed at interface areas between the now patterned interconnect layer 8 and the center rigid section 4, shown in FIG. 1. A pre-preg or adhesive section 32 is placed on the transition layers 14 and the interconnect layer 8. The pre-preg or adhesive section 32 is made of either a pre-preg material or an adhesive material of the type previously described. A rigid or flexible section 34 is placed on the pre-preg or adhesive section 18. The rigid or flexible section 34 is made of either a rigid material or a flexible material of the type previously described. In an alternative process, the pre-preg or adhesive section 32 can be applied to the rigid or flexible section 34 separately, and the resulting combination can then be placed on the transition layers 14 and the interconnect layer 8. The interconnect layer 8, the transition material layers 14, the pre-preg or adhesive section 32 and the rigid or flexible section 34 are laminated together using any known lamination technique.

Figure 8:
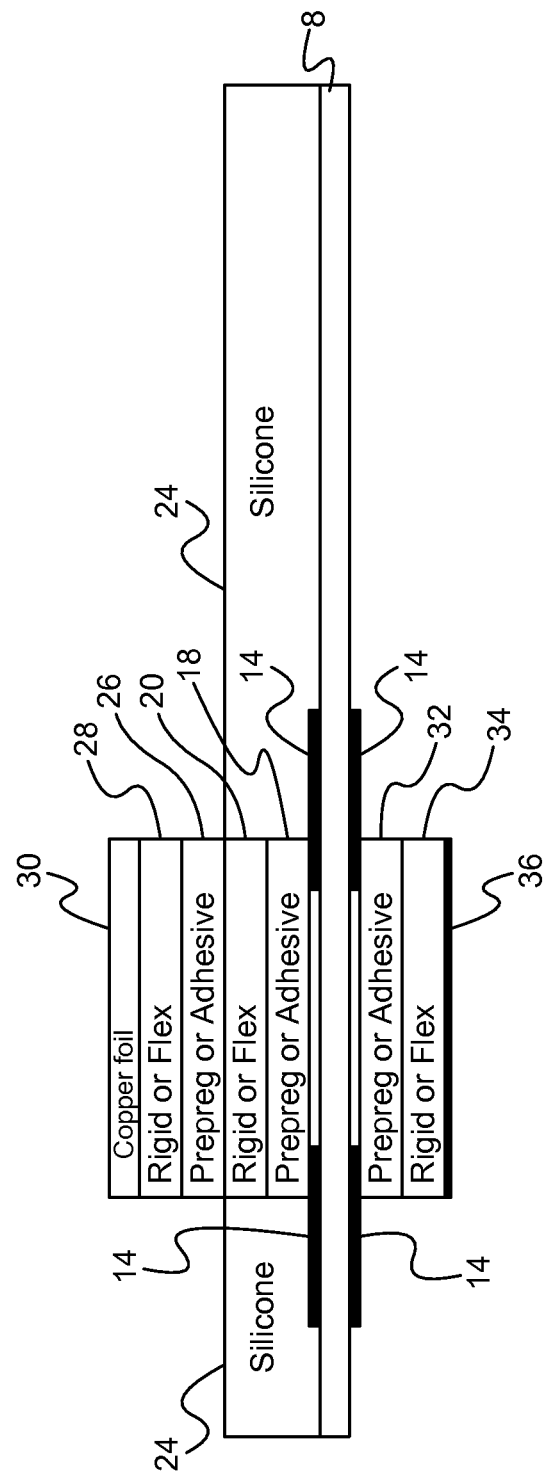

Referring to FIG. 8, a PTC 36 is placed on the rigid or flexible section 34.

Figure 9:
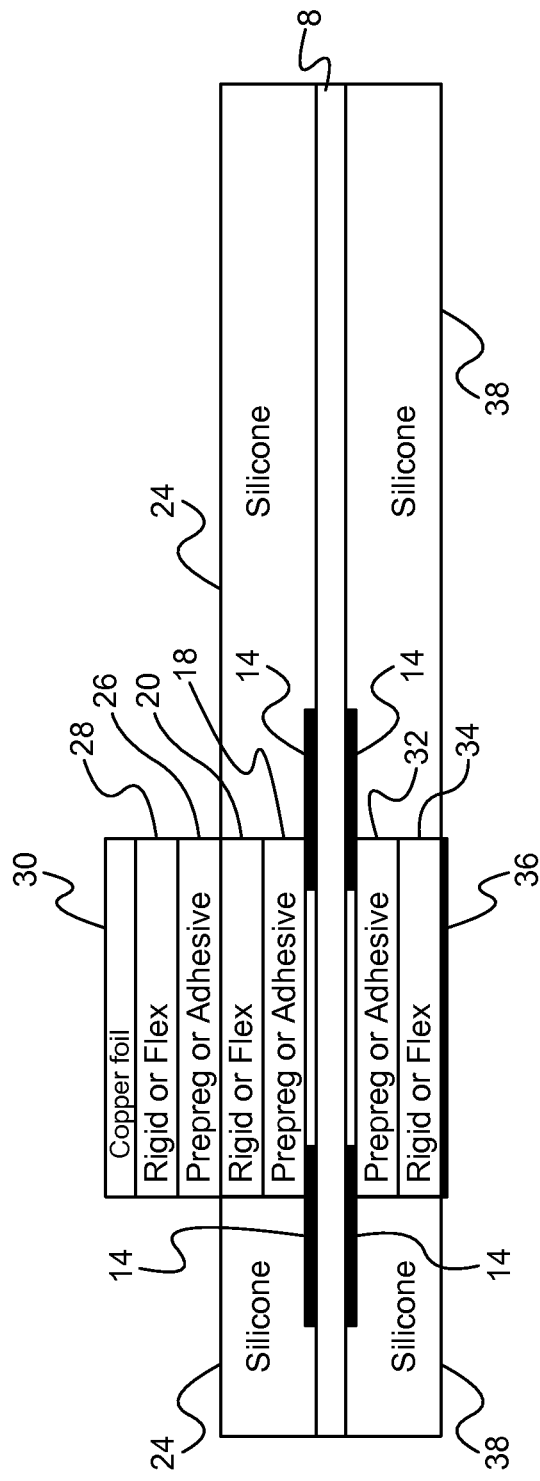

Referring to FIG. 9, a flexible insulating layer 38 is applied on the interconnect layer 8 and any exposed portions of the transition material layers 14. The flexible insulating layer 38 is made of a similar material and applied in a similar manner as the flexible insulating layer 24. The flexible insulating material 38 has an adhesive characteristic so as to adhere to interconnect layer 8 and to the stack formed by the pre-preg or adhesive section 32 and the rigid or flexible section 34. In some embodiments, a thickness of the flexible insulating layer 38 is configured so that a bottom surface is flush with a bottom surface of the rigid or flexible section 34. It is understood that reference to "top" and "bottom" surfaces are merely in reference to the orientation of the flexible circuit board shown in the Figures.

Figure 10:
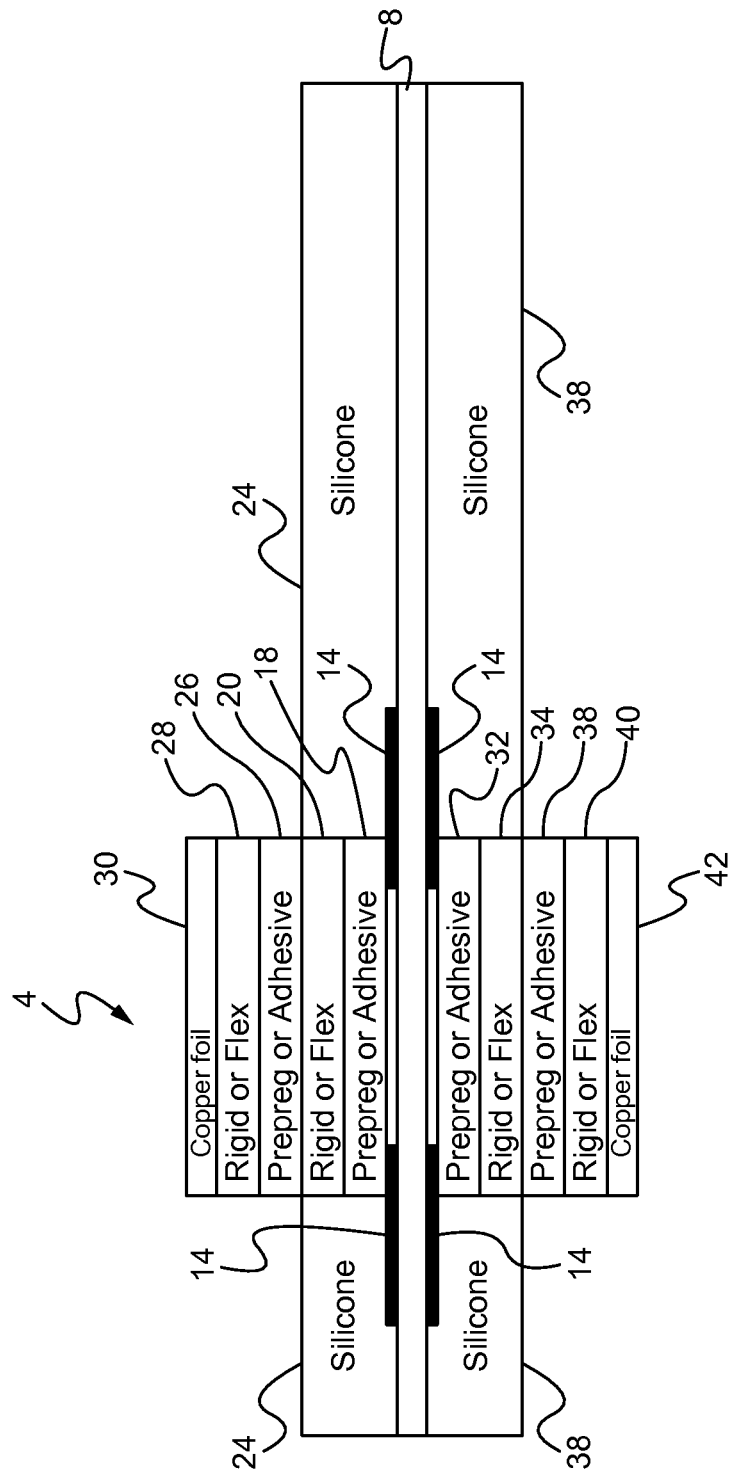

Referring to FIG. 10, the PTC 36 is removed. A pre-preg or adhesive section 38 is placed on the rigid or flexible section 34. The pre-preg or adhesive section 38 is made of either a pre-preg material or an adhesive material of the type previously described. A rigid or flexible section 40 is placed on the pre-preg or adhesive section 38. The rigid or flexible section 40 is made of either a rigid material or a flexible material of the type previously described. An interconnect layer 42 is placed on the rigid or flexible section 40. In some embodiments, the interconnect layer 42 is a copper foil. In an alternative process, the pre-preg or adhesive section 38 can be applied to the rigid or flexible section 40 separately, and the resulting combination can then be placed on the rigid or flexible section 34. The rigid or flexible section 34, the pre-preg or adhesive section 38, the rigid or flexible section 40 and the interconnect layer 42 are laminated together using any known lamination technique. In some embodiments, one or more transition material layers can be placed on the rigid or flexible section 34 and the flexible insulating layer 38 prior to placing the pre-preg or adhesive section 38. The interconnect layers 30 and 42 are patterned to form the desired configuration of interconnects. In some embodiments, the interconnects form high density interconnects that can each be used to mount an electronic device. The interconnect layers 30 and 42 can be patterned using any conventional patterning technique. For example, in the case where the interconnect layers 30 and 42 are copper foils, the copper foils are imaged and etched. Additionally, through vias can be formed to provide interconnects between the interconnect layers 30 and 42 and the interconnect layer 8. Still additionally, intermediate interconnect layers can be formed between any two sections in the center rigid section 4, and through vias can be formed between any interconnect layers. Such intermediate interconnect layers can be formed using additional processing steps of placing, laminating and patterning an interconnect layer, such as a copper foil, at proper times during the aforementioned process steps. For example, after the steps performed related to FIG. 4, the PTC 22 can be removed and an interconnect layer can be placed on the rigid or flexible section 20, laminated and patterned. At this point, through vias can also be formed through the rigid or flexible section 20 and the pre-preg or adhesive section 18 to interconnect with the interconnect layer 8.

The present invention has been described in terms of specific embodiments incorporating details to facilitate the understanding of the principles of construction and operation of the flexible circuit board. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A flexible circuit board comprising:
   a. a flexible multi-layer body comprising an interconnect layer, a first flexible insulating layer and a second flexible insulating layer, wherein the interconnect layer comprises a first surface and a second surface opposite the first surface, further wherein the first flexible insulating layer is in contact with the first surface of the interconnect layer and the second flexible insulating layer is in contact with the second surface of the interconnect layer;
   b. a center section that is more rigid than the flexible multi-layer body, wherein the center section comprises the interconnect layer such that the interconnect layer extends as a common layer to both the flexible multi-layer body and the center section, further wherein the center section further comprises a first printed circuit stack stacked on the first surface of the interconnect layer and a second printed circuit stack stacked on the second surface of the interconnect layer, the first printed circuit stack and the second printed circuit stack each comprising one or more rigid or flexible layers and one or more pre-preg or adhesive layers: and
   c. a transition material positioned at one or more transition locations between the flexible multi-layer body and the center section in order to provide structural support, wherein the transition material has a lower elasticity than first and second flexible insulating layers of the flexible multi-layer body and a higher elasticity than the center section, further wherein a first portion of the transition material extends partially into the center section such that the first portion is positioned between the first surface of the interconnect layer and the first printed circuit stack, and a second portion of the transition material extends partially into the flexible multi-layer body such that the second portion is positioned between the first surface of the interconnect layer and the first flexible insulating layer, wherein the transition material occupies a position overlapping a first portion of the center section adjacent to the flexible multi-layer body while a remaining second portion of the center section is unoccupied by the transition material, further wherein the transition material further occupies a position overlapping a first portion of the flexible multi-layer body adjacent to the first portion of the center section while a remaining second portion of the flexible multi-layer body is unoccupied by the transition material.

2. The flexible circuit board of claim 1 wherein the transition material is configured to minimize, reduce, if not prevent the flexible multi-layer body from cracking as the flexible multi-layer body is flexed, bent or twisted.

3. The flexible circuit board of claim 1 wherein the transition material has a lower elasticity than the first and second flexible insulating layers of the flexible multi-layer body, but a higher elasticity than the center section.

4. The flexible circuit board of claim 1 wherein the transition material is positioned at a high stress location of the flexible circuit board.

5. The flexible circuit board of claim 1 wherein the transition material comprises an open weave interlocking fabric.

6. The flexible circuit board of claim 1 wherein the rigid sections comprise one of glass-filled material, pre-preg or foil laminates.

7. The flexible circuit board of claim 1 wherein the flexible sections comprise one of polyimide, polyethylene teraphthalate (PET), polyethylene nitride (PEN) or polyurethane.

8. The flexible circuit board of claim 1 wherein the first and second flexible insulating layers comprise one of silicone or polyurethane.

9. The flexible circuit board of claim 1 wherein the interconnect layer comprises a copper foil patterned to form one or more interconnects.

10. The flexible circuit board of claim 1 wherein a remaining portion of the first surface of the interconnect layer is unoccupied by the transition material.

11. The flexible circuit board of claim 1 further comprising a second transition material wherein a first portion of the second transition material extends partially into the center section such that the first portion of the second transition material is positioned between the second surface of the interconnect layer and the second printed circuit stack, and a second portion of the second transition material extends partially into the flexible multi-layer body such that the second portion of the second transition material is positioned between the second surface of the interconnect layer and the second flexible insulating layer.

12. A flexible circuit board comprising:
    a. a flexible multi-layer body comprising an interconnect layer, a first stretchable insulating layer and a second stretchable insulating layer, wherein the interconnect layer comprises a first surface and a second surface opposite the first surface, further wherein the first stretchable insulating layer is in contact with the first surface of the interconnect layer and the second stretchable insulating layer is in contact with the second surface of the interconnect layer, wherein
the interconnect layer includes interconnects formed in a non-linear pattern to allow the interconnect layer to be stretched;
    b. a center section that is more rigid than the flexible multi-layer body, wherein the center section comprises the interconnect layer such that the interconnect layer extends as a common layer to both the flexible multi-layer body and the center section, further wherein the center section further comprises a first printed circuit stack stacked on the first surface of the interconnect layer and a second printed circuit stack stacked on the second surface of the interconnect layer, the first printed circuit stack and the second printed circuit stack each comprising one or more rigid or flexible layers and one or more pre-preg or adhesive layers: and
    c. a transition material positioned at one or more transition locations between the flexible multi-layer body and the center section in order to provide structural support, wherein the transition material has a lower elasticity than the first and second stretchable insulating layers of the flexible multi-layer body and a higher elasticity than the center section, further wherein a first portion of the transition material extends partially into the center section such that the first portion is positioned between the first surface of the interconnect layer and the first printed circuit stack, and a second portion of the transition material extends partially into the flexible multi-layer body such that the second portion is positioned between the first surface of the interconnect layer and the first stretchable insulating layer, wherein the transition material occupies a position overlapping a first portion of the center section adjacent to the flexible multi-layer body while a remaining second portion of the center section is unoccupied by the transition material, further wherein the transition material further occupies a position overlapping a first portion of the flexible multi-layer body adjacent to the first portion of the center section while a remaining second portion of the flexible multi-layer body is unoccupied by the transition material.

13. The flexible circuit board of claim 12 wherein the non-linear pattern of the interconnects forms an S-shape or a zig-zap shape.

14. The flexible circuit board of claim 12 wherein the transition material is configured to minimize, reduce, if not prevent the flexible multi-layer body from cracking as the flexible multi-layer body is flexed, bent or twisted.

15. The flexible circuit board of claim 12 wherein the transition material has a lower elasticity than the first and second stretchable insulating layers of the flexible multi-layer body, but a higher elasticity than the center section.

16. The flexible circuit board of claim 12 wherein the transition material is positioned at a high stress location of the flexible circuit board.

17. The flexible circuit board of claim 12 wherein the transition material comprises an open weave interlocking fabric.

18. The flexible circuit board of claim 12 wherein the rigid sections comprise one of glass-filled material, pre-preg or foil laminates.

19. The flexible circuit board of claim 12 wherein the flexible sections comprise one of polyimide, polyethylene teraphthalate (PET), polyethylene nitride (PEN) or polyurethane.

20. The flexible circuit board of claim 12 wherein the first and second stretchable insulating layers comprise one of silicone or polyurethane.

* * * * *

UNITED STATES PATENT AND TRADEMARK OFFICE
CERTIFICATE OF CORRECTION

| | | |
|---|---|---|
| PATENT NO. | : 9,661,743 B1 | Page 1 of 1 |
| APPLICATION NO. | : 14/565247 | |
| DATED | : May 23, 2017 | |
| INVENTOR(S) | : Mark Bergman and Joan K. Vrtis | |

It is certified that error appears in the above-identified patent and that said Letters Patent is hereby corrected as shown below:

In the Claims

At Column 8, Line 10, Claim 1, please include "the" between "than" and "first".

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*